(12) United States Patent
Lim

(10) Patent No.: US 9,456,271 B2
(45) Date of Patent: Sep. 27, 2016

(54) METHOD AND APPARATUS FOR OUTPUTTING AUDIO SIGNAL

(75) Inventor: Dong-hyun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 840 days.

(21) Appl. No.: 13/316,029

(22) Filed: Dec. 9, 2011

(65) Prior Publication Data

US 2012/0230520 A1  Sep. 13, 2012

(30) Foreign Application Priority Data

Mar. 9, 2011 (KR) .................. 10-2011-0021045

(51) Int. Cl.
*H02B 1/00* (2006.01)
*H03F 3/38* (2006.01)
*H04R 3/00* (2006.01)
*H03F 3/217* (2006.01)

(52) U.S. Cl.
CPC ............. *H04R 3/00* (2013.01); *H03F 3/217* (2013.01); *H03F 2200/351* (2013.01)

(58) Field of Classification Search
CPC ............ H03F 3/217; H03F 2200/351; H03F 2200/03; H03K 7/08; H03K 7/10; H03K 9/08
USPC ....... 381/123, 111, 80, 81, 120, 121; 700/94; 330/10, 207 A, 251
See application file for complete search history.

(56) References Cited

U.S. PATENT DOCUMENTS

| | | | | | |
|---|---|---|---|---|---|
| 4,776,036 | A | * | 10/1988 | Hulsey et al. ................ | 455/108 |
| 4,866,737 | A | * | 9/1989 | Seifried ........................ | 375/238 |
| 6,320,465 | B1 | * | 11/2001 | Masini et al. ............ | 330/207 A |
| 7,382,188 | B2 | * | 6/2008 | Talty .............................. | 330/251 |
| 7,839,211 | B2 | * | 11/2010 | Nielsen .......................... | 330/10 |
| 8,098,091 | B1 | * | 1/2012 | Anderskouv et al. .......... | 330/11 |
| 2003/0117222 | A1 | * | 6/2003 | Anderson ..................... | 331/100 |
| 2007/0054638 | A1 | | 3/2007 | Song et al. | |
| 2007/0165740 | A1 | * | 7/2007 | Koslar et al. ................. | 375/271 |
| 2013/0223651 | A1 | * | 8/2013 | Hoyerby ...................... | 381/120 |

FOREIGN PATENT DOCUMENTS

| | | |
|---|---|---|
| CN | 1929300 A | 3/2007 |
| CN | 101192810 A | 6/2008 |
| JP | 2006-313958 A | 11/2006 |
| KR | 10-0750127 B1 | 8/2007 |
| WO | WO 0215393 A2 | 2/2002 |

OTHER PUBLICATIONS

Communication dated Mar. 25, 2016, issued by the Intellectual Property Office of P.R. China in counterpart Chinese Application No. 201210061834.4.

* cited by examiner

*Primary Examiner* — Xu Mei
(74) *Attorney, Agent, or Firm* — Sughrue Mion, PLLC

(57) ABSTRACT

An audio signal outputting apparatus and method for adjusting an output gain of an audio signal are provided. The audio signal outputting apparatus includes: a pulse width modulation (PWM) unit which generates a carrier signal, compares a signal level of the carrier signal with a signal level of an audio signal, and generates a PWM signal based on a result of the comparison; a controller which, based to a level of the audio signal, controls the PWM unit to change a signal shape of the carrier signal to adjust a duration of a logic high level of the PWM signal; and a switching power unit which amplifies the PWM signal generated by the PWM unit and outputs the amplified PWM signal.

23 Claims, 5 Drawing Sheets

METHOD AND APPARATUS FOR OUTPUTTING AUDIO SIGNAL

CROSS-REFERENCE TO RELATED PATENT APPLICATION

This application claims priority from Korean Patent Application No. 10-2011-0021045, filed on Mar. 9, 2011 in the Korean Intellectual Property Office, the disclosure of which is incorporated herein in its entirety by reference.

BACKGROUND

1. Field

Apparatuses and methods consistent with exemplary embodiments relate to outputting an audio signal, and more particularly, to outputting an audio signal for increasing an operation speed.

2. Description of the Related Art

Audio power amplifiers (amps) receive audio signals and output audible signals, and are generally categorized into class A, class B, class AB, and class D. Here, class D power amps are widely used due to reduced deterioration of amplification efficiency as compared to class A power amps, class B power amps, and class AB power amps. Class D power amps switch an audio signal by converting the audio signal to a pulse width modulation (PWM) signal. Class D power amps are also referred to as digital amps.

Digital amps are widely used because of features such as little data conversion loss and a theoretical amplification efficiency of 100%. In such a digital amp, it is important to output an input audio signal without generating a signal distortion according to the maximum output power.

SUMMARY

One or more exemplary embodiments provide methods of outputting an audio signal for rapidly adjusting an output gain of an audio signal without delay, and apparatuses for outputting an audio signal by using the methods.

One or more exemplary embodiments also provide methods of outputting an audio signal for adjusting an output gain of an audio signal while minimizing deterioration of audio quality, and apparatuses for outputting an audio signal by using the methods.

According to an aspect of an exemplary embodiment, there is provided an audio signal outputting apparatus including a pulse width modulation (PWM) unit which generates a carrier signal, compares a signal level of the carrier signal with a signal level of an audio signal, and generates a PWM signal based on a result of the comparison; a controller which, based to a level of the audio signal, controls the PWM unit to change a signal shape of the carrier signal to adjust a duration of a logic high level of the PWM signal; and a switching power unit which amplifies the PWM signal generated by the PWM unit and outputs the amplified PWM signal.

When the level of the audio signal is higher than a predetermined standard level, the controller may control the PWM unit to change the signal shape of the carrier signal so as to reduce the duration of the logic high level of the PWM signal.

When the level of the audio signal is lower than a predetermined standard level, the controller may control the PWM unit to change the signal shape of the carrier signal so as to increase the duration of the logic high level of the PWM signal.

The controller may further include a storage unit which stores information about the signal shape of the carrier signal corresponding to the level of the audio signal.

The controller may control the PWM unit to change the signal shape of the carrier signal so as to increase or reduce the duration of the logic high level of the PWM signal for each signal level period of the audio signal having different range of levels of the audio signal.

The controller may control the PWM unit to change the signal shape of the carrier signal so as to reduce the duration of the logic high level of the PWM signal in a first period in which a zero cross of the audio signal occurs.

The controller may control the PWM unit to change the signal shape of the carrier signal so as to increase the duration of the logic high level of the PWM signal in a second period in which the level of the audio signal is equal to or higher than an upper limit of the first period and is lower than or equal to a predetermined standard level.

The controller may control the PWM unit to change the signal shape of the carrier signal so as to reduce the duration of the logic high level of the PWM signal in a third period in which the level of the audio signal is equal to or higher than the predetermined standard level.

The audio signal outputting apparatus may further include a loop filter which detects an output level of the amplified PWM signal and monitors whether the amplified PWM signal exceeds a maximum output level.

The controller may receive a result of the monitoring from the loop filter, and when the level of the amplified PWM signal exceeds the maximum output level, the controller may change the signal shape of the carrier signal so as to reduce the duration of the logic high level of the PWM signal.

According to an aspect of another exemplary embodiment, there is provided a method of outputting an audio signal, detecting a level of an audio signal; generating a carrier signal having a signal shape that is changed based on the detected level of the audio signal to adjust a duration of a logic high level of a PWM signal; comparing a signal level of the carrier signal with the level of the audio signal; generating the PWM signal based on a result of the comparing; and amplifying the PWM signal and outputting the amplified PWM signal.

BRIEF DESCRIPTION OF THE DRAWINGS

The above and other aspects will become more apparent by describing in detail exemplary embodiments with reference to the attached drawings in which.

DETAILED DESCRIPTION OF EXEMPLARY EMBODIMENTS

Figure 1:
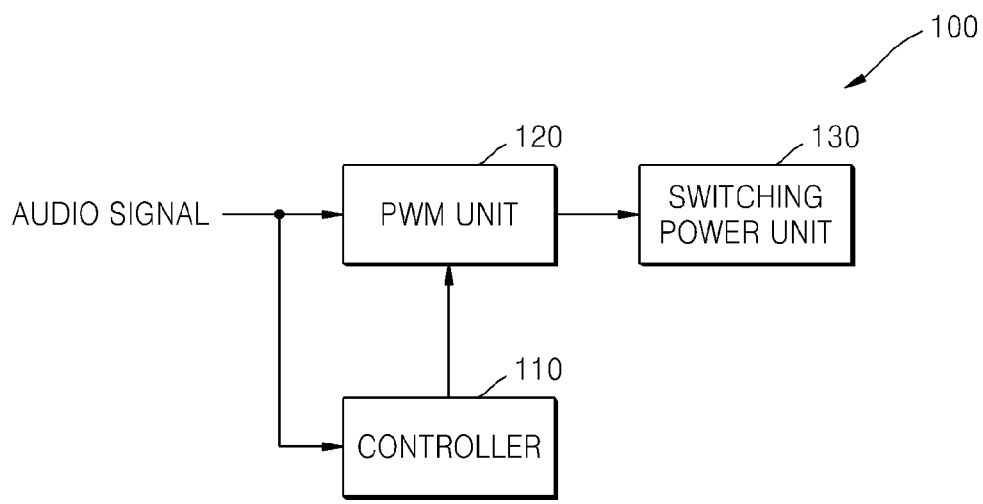
FIG. 1 is a block diagram of an audio signal outputting apparatus according to an exemplary embodiment.

Hereinafter, exemplary embodiments will be described with reference to the attached drawings. Exemplary embodiments may, however be embodied in many different forms and should not be construed as being limited to the exemplary embodiments set forth herein; rather, these exemplary embodiments are provided so that this disclosure will be thorough and complete, and will fully convey the inventive concept to those skilled in the art. In the drawings, like reference numerals denote like elements. Hereinafter, expressions such as "at least one of," when preceding a list of elements, modify the entire list of elements and do not modify the individual elements of the list.

An audio amplifier system or an audio signal outputting apparatus may be designed having a maximum output based on a predetermined input level. In some cases, the audio signal outputting apparatus may receive an audio signal recorded at a level higher than a standard level. In this case, an amplifier which outputs an audio signal in the audio signal outputting apparatus receives excessive input.

When an audio signal recorded at a level higher than the standard level is reproduced at a maximum volume level, the audio signal outputting apparatus performs an operation that exceeds the maximum output. That is, clipping may occur. This operation may damage internal components of the audio amplifier system, such as a digital amplifier, a speaker, a switching mode power supply (SMPS), and the like. For example, a speaker may be burned or cut and thus may not generate a sound. Circuits of the SMPS or the digital amplifier may be damaged due to an increase in an inner temperature of the audio amplifier system.

In order to prevent the audio signal outputting apparatus from performing an operation exceeding the maximum output, an output gain may be controlled. The digital amplifier may control output of a signal through pulse width modulation (PWM) and may compress, expand, or boost a size of an audio signal through PWM.

Herein, compression, expansion, or boost of a size of an audio signal refers to changing a gain of an input audio signal and outputting the input audio signal.

In an analog method, a gain of an input/output audio signal may be controlled by using a variable gain amplifier (VGA) or a voltage controlled amplifier. On the other hand, in a digital method, a gain of an audio signal may be controlled by using a separate signal processing block which compresses or expands a signal.

As described above, in order to control output of an audio signal, a separate amplifier or a processing block is used in addition to a component for PWM. Thus, a method and apparatus for outputting an audio signal and for minimizing distortion of an audio signal while simplifying a processing block for controlling a gain, according to one or more exemplary embodiments will be described in detail.

FIG. 1 is a block diagram of an audio signal outputting apparatus 100 according to an exemplary embodiment.

Referring to FIG. 1, the audio signal outputting apparatus 100 includes a controller 110, a PWM unit 120 and a switching power unit 130.

The controller 110 receives an audio signal and detects a signal level of the received audio signal. In addition, according to the detected level of the audio signal, the controller 110 controls the PWM unit 120 to change a signal shape of a carrier signal so that a duration of a logic high level of a PWM signal may be increased or decreased.

In detail, when a detected signal level is greater than a predetermined standard level, the controller 110 controls the PWM unit 120 to change a signal shape of a carrier signal such that a duration of a logic high level of a PWM signal may be decreased. For example, the controller 110 may detect an average signal level of an input audio signal or a peak signal level of the audio signal as a signal level of the audio signal. In addition, the controller 110 may determine a signal shape of a carrier signal corresponding to a detected signal level of an audio signal, and output a change control signal for outputting a carrier signal having the determined signal shape to the PWM unit 120.

Herein, the predetermined standard level is an upper limit value for determining whether an audio signal is a signal that, when converted into a PWM signal or the like, and finally output, exceeds a maximum output of the audio signal outputting apparatus 100. That is, if a signal level of an audio signal exceeds the predetermined standard level, when the audio signal is finally reproduced, components of the audio signal outputting apparatus 100 may be damaged. The predetermined standard level may be designed to be a value that is optimized according to at least one of maximum output power, speaker performance, reliability of audio equipment, and the like, which may be contained in product specifications of the audio signal outputting apparatus 100.

In addition, a signal shape of a carrier signal may be changed by the controller 110 in consideration of user preference. For example, in a case of an audio signal with a middle level, when a user wants to hear a sound at a higher volume, the controller 110 may change a signal shape of a carrier signal such that a duration of a logic high level of a PWM signal may be increased during a period in which a level of an audio signal is equal to or lower than the predetermined standard level. That is, during a period in which a level of an audio signal is equal to or lower than the predetermined standard level, a volume may be increased.

The controller 110 may store a database obtained by matching a level of an audio signal and information about a signal shape of a carrier signal corresponding to the level to each other. For example, the database may be stored in a predetermined storage space (not shown) included in the controller 110 or a separate storage space (not shown) of the audio signal outputting apparatus 100. The database may be designed or stored by at least one of a manufacturer and a user of the audio signal outputting apparatus 100.

The PWM unit 120 generates a carrier signal with a signal shape that is changed according to control of the controller 110 and compares the carrier signal and the audio signal so as to generate a PWM signal. A detailed structure and operation of the PWM unit 120 will be described with reference to FIGS. 2 and 3.

The switching power unit 130 amplifies power of the PWM signal generated by the PWM unit 120 so as to generate an amplified PWM signal. For example, the switching power unit 130 amplifies an amplitude of the generated PWM signal according to the maximum output of the audio signal outputting apparatus 100 and outputs the amplified PWM signal. While the audio signal outputting apparatus 100 according to the present exemplary embodiment includes a switching power unit 130 to amplify the PWM signal, it is understood that another exemplary embodiment is not limited thereto. For example, according to another exemplary embodiment, the switching power unit 130 may be omitted, and the audio signal outputting apparatus 100 may output the PWM signal without amplifying the generated PWM signal. Furthermore, it is understood that the audio signal outputting apparatus 100 according to one or more exemplary embodiments may output the PWM signal to external speakers, to another device or circuit to process the PWM signal, may output the PWM signal using internal speakers, etc.

Figure 2:
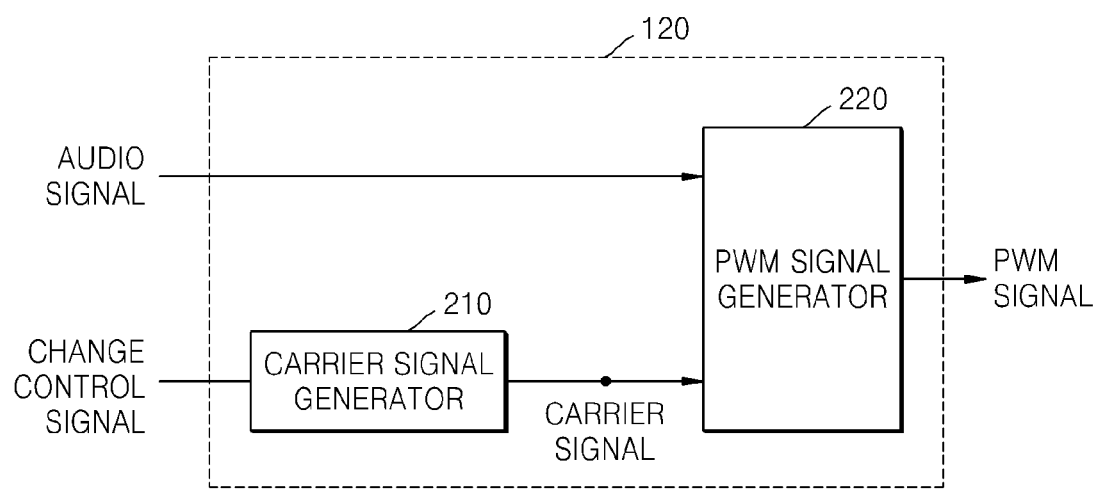
FIG. 2 is a detailed block diagram of a pulse width modulation (PWM) unit of FIG. 1, according to an exemplary embodiment.

FIG. 2 is a detailed block diagram of the PWM unit 120 of FIG. 1, according to an exemplary embodiment.

Referring to FIG. 2, the PWM unit 120 may include a carrier signal generator 210 and a PWM signal generator 220.

In response to change control signals input by the controller 110, the carrier signal generator 210 generates carrier signals corresponding to the change control signals. The carrier signals are output having different signal shapes according to the change control signals. Herein, a change control signal contains information for changing a signal shape of a carrier signal. For example, the change control signal may contain information about a signal shape of a carrier signal itself. In addition, if the carrier signal generator 210 contains information about carrier signals with a plurality of signal shapes, each of change control signals may contain information for reading one carrier signal from among a plurality of carrier signals each having different shape, for example, an address signal or the like.

The PWM signal generator 220 receives an audio signal and a carrier signal, compares a signal level of the audio signal and a signal level of the carrier signal and outputs a PWM signal having a pulse width modulated according to a result of the comparison. The generating of the PWM signal will be described in detail with reference to FIG. 3.

Figure 3:
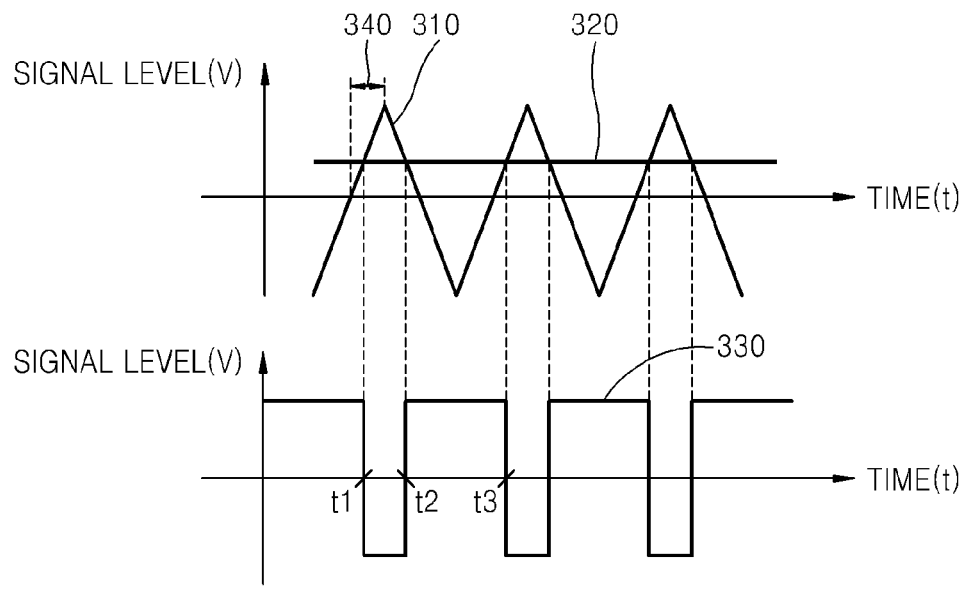
FIG. 3 shows examples of a carrier signal and a PWM signal generated by the PWM unit of FIG. 2, according to an exemplary embodiment.

FIG. 3 shows examples of a carrier signal and a PWM signal generated by the PWM unit 120 of FIG. 2, according to an exemplary embodiment.

FIG. 3 shows a case where a level of an audio signal detected by the controller 110 is a middle level such as half of magnitude. For example, when the level of the detected audio signal is a middle level, an audio signal outputting apparatus may not perform an operation that exceeds its maximum output. Thus, a gain value of the audio signal does not have to be adjusted. In addition, when a level of the audio signal is a mean level, a carrier signal may be output so as to generate a PWM signal having a duty ratio maintained at 50:50.

A gain in a case where a duty ratio is 50:50 when a level of an audio signal is a mean level is referred to as a unity gain. In addition, a carrier signal for generating a PWM signal corresponding to the unity gain is referred to as a unity gain carrier signal.

In FIG. 3, an X-axis represents time and a Y-axis represent a signal level. In addition, the signal level may be in units of voltage (V).

Referring to FIG. 3, in response to a change control signal, the carrier signal generator 210 generates and outputs a carrier signal 310 corresponding to the change control signal.

The PWM signal generator 220 may compare a signal level of the carrier signal 310 and a signal level of an audio signal 320. When the signal level of the carrier signal 310 is greater than the signal level of the audio signal 320, the PWM signal generator 220 may output a PWM signal 330 at a logic low level. In addition, when the signal level of the carrier signal 310 is less than the signal level of the audio signal 320, the PWM signal generator 220 may output the PWM signal 330 at a logic high level.

For example, in a period from t1 to t2, in which the signal level of the carrier signal 310 is higher than the signal level of the audio signal 320, the PWM signal generator 220 outputs the PWM signal 330 at the logic low level. In a period from t2 to t3, in which the signal level of the carrier signal 310 is lower than the signal level of the audio signal 320, the PWM signal generator 220 outputs the PWM signal 330 at the logic high level.

The PWM unit 120 for outputting a carrier signal changed according to a signal level of an audio signal detected by the controller 110 will be described in detail with reference to FIGS. 4 and 5.

Figure 4:
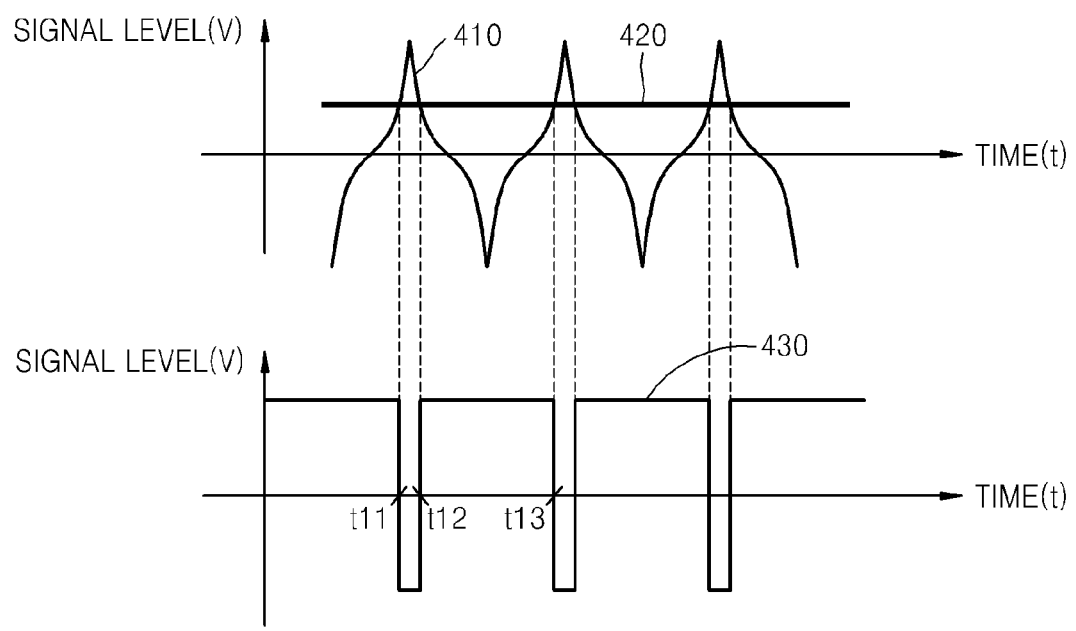
FIG. 4 shows examples of a carrier signal and a PWM signal generated by the PWM unit of FIG. 2, according to another exemplary embodiment.

FIG. 4 shows examples of a carrier signal and a PWM signal generated by the PWM unit 120 of FIG. 2, according to another exemplary embodiment.

When a level of an audio signal is lower than an average recording level, a volume of an output sound may be low, and thus user's satisfaction with respect to sound quality may be low. In this case, the average recording level may be a level of an optimized audio signal at which a corresponding audio signal outputting apparatus may operate while maintaining a maximum output. As described above, an audio signal outputting apparatus for outputting an audio signal by using a digital amplifier may be designed having a maximum output based on an average recording level.

Referring to FIG. 4, an output carrier signal corresponding to when a level of an audio signal detected by the controller 110 is lower than the average recording level is illustrated. For example, the controller 110 detects a signal level of an audio signal. The detected signal level is compared with the average recording level, and if the detected signal level is determined to be lower than the average recording level, the carrier signal generator 210 may be controlled so as to output a carrier signal for increasing a gain value to increase a volume of an output signal.

The controller 110 may control the PWM unit 120 to change a signal shape of a carrier signal 410 so as to increase a duration of a logic high level of a PWM signal 430, according to a level of an audio signal 420, as shown in FIG. 4. For example, when the level of the audio signal 420 is lower than the average recording level or when, for example, a peak level of the audio signal 420 is lower than the above-described predetermined standard level, the controller 110 may control the PWM unit 120 to change the signal shape of the carrier signal 410 so as to increase the duration of the logic high level of the PWM signal 430.

Compared to FIG. 3, when the signal shape of the carrier signal 410 is close to that of FIG. 4, the duration of the logic high level of the PWM signal 430 is increased. For example, when the carrier signal 410 has the signal shape shown in FIG. 4, the PWM signal 430 is output at a logic low level in a period from t11 to t12, and is output at the logic high level in a period from t12 to t13. That is, by changing the signal shape of the carrier signal 410 according to control of the controller 110, a gain of the audio signal 420 may be increased and the volume of the output sound may also be increased.

Figure 5:
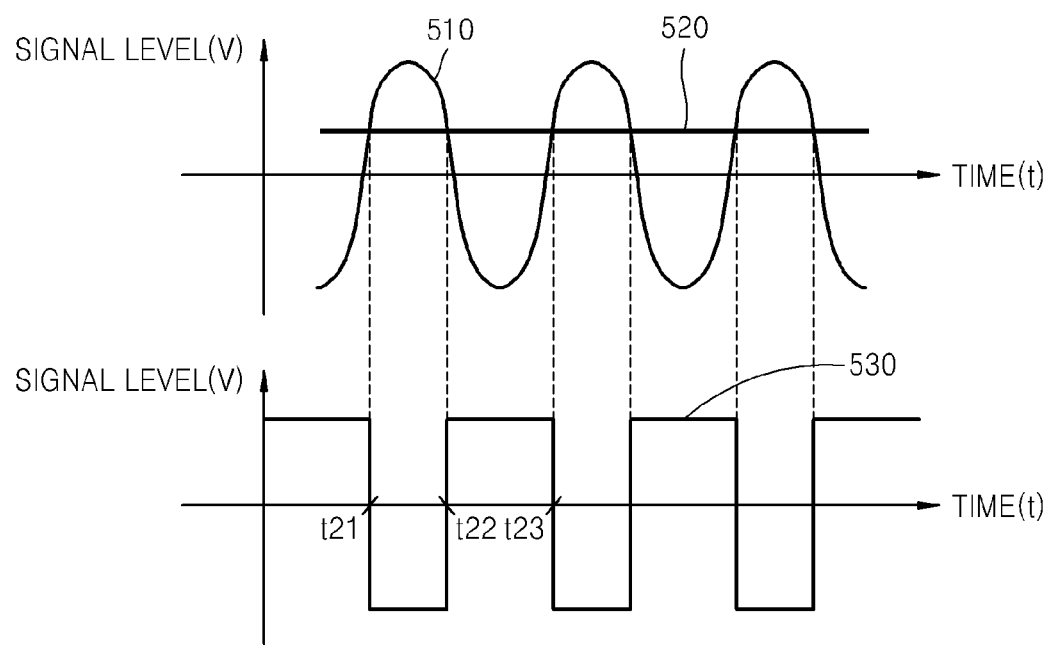
FIG. 5 shows examples of a carrier signal and a PWM signal generated by the PWM unit of FIG. 2, according to another exemplary embodiment.

FIG. 5 shows examples of a carrier signal and a PWM signal generated by the PWM unit 120 of FIG. 2, according to another exemplary embodiment.

When a level of an audio signal is higher than an average recording level, or when a peak level of the audio signal is higher than the above-described predetermined standard level, an audio signal outputting apparatus may perform an operation that exceeds its maximum output and may be damaged.

Referring to FIG. 5, the controller 110 may control the PWM unit 120 to change a signal shape of a carrier signal 510 so as to increase a duration of a logic low level of a PWM signal 530, according to a level of an audio signal 520, as shown in FIG. 5. For example, when the level of the audio signal 520 is higher than the average recording level or when, for example, a peak level of the audio signal 520 is higher than the above-described predetermined standard level, the controller 110 may control the PWM unit 120 to change the signal shape of the carrier signal 510 so as to increase the duration of the logic low level of the PWM signal 530.

Compared to FIG. 3, when the signal shape of the carrier signal 510 is close to that of FIG. 5, the duration of the logic high level of the PWM signal 530 is increased. For example, when the carrier signal 510 has a signal shape shown in FIG. 5, the PWM signal 530 is output at a logic low level in a period from t21 to t22, and is output at the logic high level in a period from t22 to t23. That is, by changing the signal shape of the carrier signal 510 according to control of the controller 110, a gain of the audio signal 520 may be reduced and an audio signal outputting apparatus may be prevented from performing an operation that exceeds its maximum output A signal shape of a carrier signal corresponding to a level of an audio signal may be experimentally optimized and designed in consideration with maximum output power, reliability, or the like of an audio signal outputting apparatus. In addition, as described above, the signal shape of the carrier signal may be designed or stored by at least one selected from the group consisting of a manufacturer and a user of the audio signal outputting apparatus 100.

Figure 6:
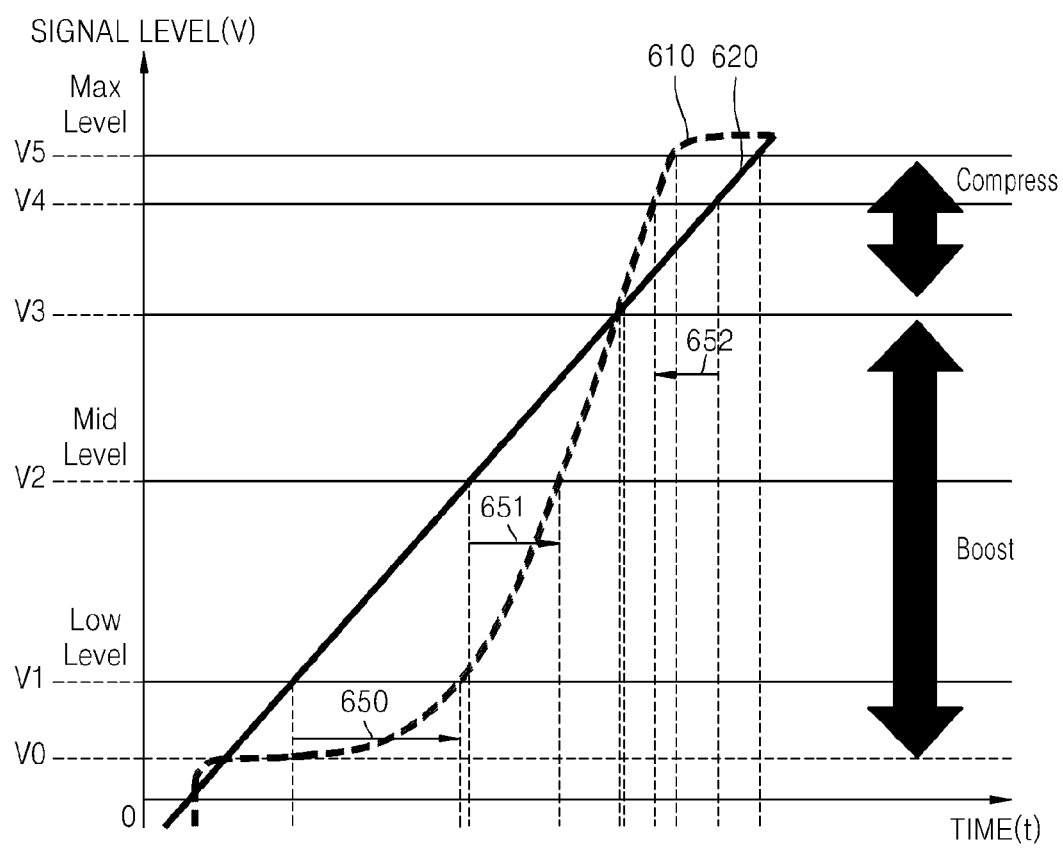
FIG. 6 shows examples of a carrier signal and a PWM signal generated by the PWM unit of FIG. 2 in detail, according to an exemplary embodiment.

FIG. 6 shows examples of a carrier signal and a PWM signal generated by the PWM unit 120 of FIG. 2, according to an exemplary embodiment.

In addition, the controller 110 may change a signal shape of a carrier signal so as to adjust (i.e., increase or reduce) a duration of a logic high level of a PWM signal for each of signal level periods of an audio signal.

Referring to FIG. 6, a carrier signal output according to control of the controller 110 may have a signal shape for increasing or reducing a duration of a logic high level of a PWM signal for each signal level period. FIG. 6 shows a magnified portion of a ¼ period of a carrier signal. That is, the carrier signal shown in FIG. 6 corresponds to a ¼ period 340 of the carrier signal 310 of FIG. 3. In addition, in order to describe a change in a signal shape of a carrier signal by the controller 110, a single gain carrier signal 620 having a signal shape that is not changed is further shown.

The controller 110 may change a signal shape of a carrier signal 610 so as to reduce a duration of a logic high level of a PWM signal in a first period from 0 to V0 in which a level of an audio signal is zero-crossing. In general, in a period in which a signal level is almost 0, that is, zero-crossing, there is much noise. Thus, the controller 110 may change a signal shape of a carrier signal so as to reduce a gain in a period in which a code is converted.

Referring to FIG. 6, the controller 110 may control the signal shape of the carrier signal 610 so that a signal level of the carrier signal 610 may have a greater value than a signal level of the single gain carrier signal 620 in the first period in which a code is converted. Thus, the carrier signal generator 210 may output the carrier signal 610 having a signal shape shown in FIG. 6. Accordingly, in a period from 0 to V0 in which a code is converted, a duration of a logic high level of a PWM is reduced and output.

That is, the controller 110 may control the PWM unit 120 to generate a carrier signal functioning as a compressor for reducing a gain value in the first period.

In addition, the controller 110 may change the signal shape of the carrier signal 610 so as to increase a duration of a logic high level of a PWM signal in a second period in which a level of an audio signal is equal to or greater than a V0 level and is smaller than or equal to a V3 level, wherein the V0 level is an upper limit of the first period and the V3 level is a predetermined standard level. In the second period from the V0 level to the V3 level, although a volume is increased, the audio signal outputting apparatus 100 may not perform an operation that exceeds the maximum output. Thus, in the second period, user's satisfaction with respect to sound quality may be increased by increasing the volume.

Referring to FIG. 6, the carrier signal 610 has a signal level smaller than that of the single gain carrier signal 620 in the second period. When an audio signal having a V1 level is input, the carrier signal 610 may increase a duration of a logic high level of a PWM signal by a period 650 based on the single gain carrier signal 620. In addition, when an audio signal having a V2 level, that is, a half value of a signal level V5 corresponding to the maximum output, is input, the carrier signal 610 may increase a duration of a logic high level of a PWM signal by a period 651 based on the single gain carrier signal 620.

That is, the controller 110 may control the PWM unit 120 to generate a carrier signal functioning as a booster for increasing a gain value in the second period, that is, an intermediate signal level period.

In addition, the controller 110 may change a signal shape of a carrier signal so as to reduce a duration of a logic high level of a PWM signal in a third period in which a level of an audio signal is equal to or greater than V3.

Referring to FIG. 6, the carrier signal 610 has a signal level greater than that of the single gain carrier signal 620 in the third period. A lower limit of the second period may be the above-described predetermined standard level, and an upper limit of the second period may be a signal level V5 corresponding to the maximum output. For example, when an audio signal having the signal level V5 is input, the audio signal outputting apparatus 100 may output a sound at a maximum volume from among sounds that are capable of being output.

When an audio signal having a level V4 is input, the carrier signal 610 may reduce a duration of a logic high level of a PWM signal by a period 652 based on the single gain carrier signal 620.

That is, the controller 110 may control the PWM unit 120 to generate a carrier signal functioning as a compressor for reducing a gain value in the third period.

As described above with reference to FIGS. 4 through 6, the audio signal outputting apparatus 100 changes a signal shape of a carrier signal according to a signal level of an audio signal and generates the carrier signal. Thus, a gain value may be directly adjusted during generation of a PWM signal without including or using a compressor or a booster, as a separate circuit block for adjusting a gain value. That is, by changing a signal shape of a carrier signal and generating the carrier signal, without performing a separate operation of adjusting a gain, a gain may be directly adjusted during generation of a PWM signal.

Thus, a structure of the audio signal outputting apparatus 100 may be simplified, and a PWM signal having a gain value that is relatively rapidly adjusted may be generated. In addition, power consumption may be reduced by removing power consumed in a separate circuit block for adjusting a gain value.

As described with reference to FIG. 6, the audio signal outputting apparatus 100 may remove noise and may increase a volume by reducing or increasing a duration of a logic high level of a PWM signal for each respective signal level.

In addition, by changing a signal shape of a carrier signal, the audio signal outputting apparatus 100 may be controlled so as not to perform an operation that exceeds the maximum output. Thus, the audio signal outputting apparatus 100 may be prevented from being damaged and operational reliability of the audio signal outputting apparatus 100 may be increased.

Figure 7:
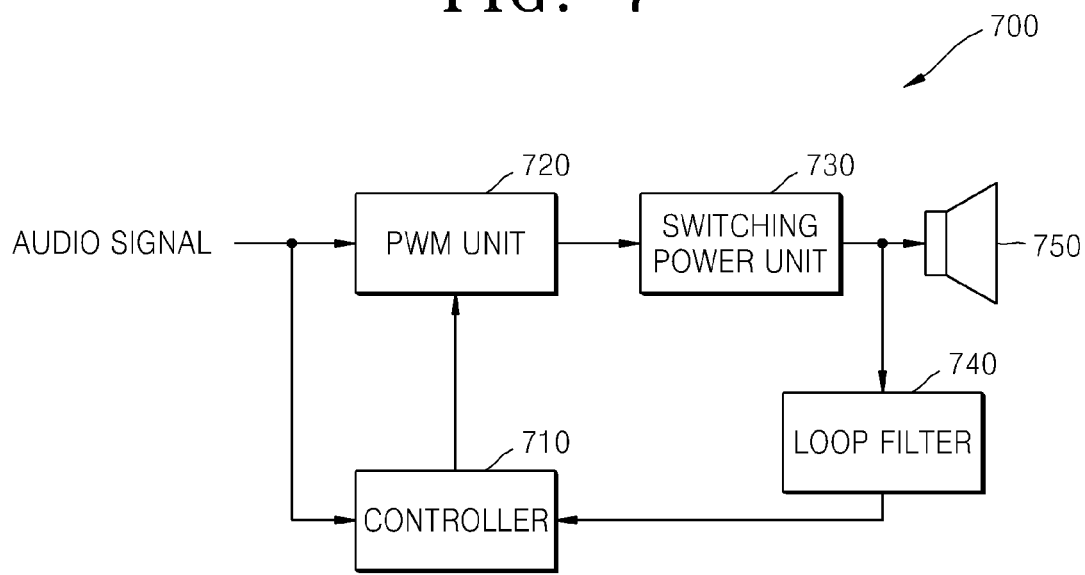
FIG. 7 is a detailed block diagram of an audio signal outputting apparatus corresponding to the audio signal outputting apparatus of FIG. 1, according to an exemplary embodiment.

FIG. 7 is a detailed block diagram of an audio signal outputting apparatus 700 corresponding to the audio signal outputting apparatus 100 of FIG. 1, according to another exemplary embodiment.

Referring to FIG. 7, the audio signal outputting apparatus 700 may further include a loop filter 740 and a speaker unit 750 in addition to the audio signal outputting apparatus 100 of FIG. 1. A controller 710, a PWM unit 720 and a switching power unit 730 correspond to the controller 110, and the PWM unit 120 and the switching power unit 130, respectively, that have been described with reference to FIGS. 1 and 2, and thus their detailed descriptions will be omitted.

The speaker unit 750 receives a PWM signal amplified by the switching unit 730, converts the PWM signal into a sound signal that is audible to human ears, and outputs the sound signal.

The loop filter 740 detects an output level of the amplified PWM signal output from the switching power unit 730. In addition, the loop filter 740 monitors whether the output level of the amplified PWM signal exceeds the maximum output level of the audio signal outputting apparatus 100.

The controller 710 receives a result of the monitoring from the loop filter 740. In addition, when it is determined that the output level of the amplified PWM signal exceeds the maximum output level, the controller 710 control the PWM unit 720 to change a signal shape of a carrier signal so as to reduce a duration of a logic high level of the PWM signal. For example, the controller 710 may limit a level of an audio signal to a maximum output level in a period in which an audio signal exceeds the maximum output level. In addition, the controller 710 may control the PWM unit 720 so as to generate a carrier signal for reducing a gain value. The generation of the carrier signal for reducing a gain value has been described with reference to FIG. 5, and thus its detailed description is omitted.

Figure 8:
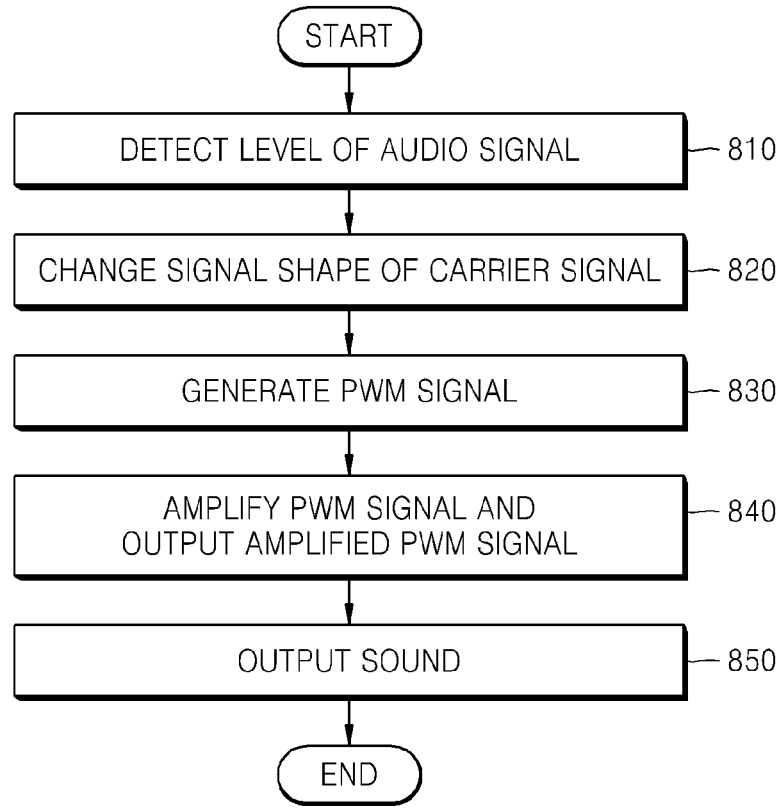
FIG. 8 is a flowchart of a method of outputting an audio signal, according to an exemplary embodiment.

FIG. 8 is a flowchart of a method of outputting an audio signal, according to an exemplary embodiment.

Referring to FIG. 8, the method according to an exemplary embodiment includes detecting a level of an audio signal received by the controller 110 (Operation 810).

According to the detected level of the audio signal, a signal shape of a carrier signal is changed so as to increase or reduce a duration of a logic high level of a PWM signal, and the carrier signal is generated (Operation 820). For example, the controller 110 may output a change control signal for changing the signal shape of the carrier signal to the PWM unit 120, and the PWM unit 120, in particular, the carrier signal generator 210, may generate the carrier signal according to the change control signal output by the controller 110.

Signal levels of the carrier signal and the audio signal are compared so as to generate the PWM signal (Operation 830). Operation 830 may be performed in the PWM unit 120, in particular, in the PWM signal generator 220.

Power of the PWM signal is amplified and the amplified PWM signal is output (Operation 840). Operation 840 may be performed by the switching power unit 130.

In addition, the method according to the present embodiment may further include changing the amplified PWM signal to a sound signal and outputting the sound signal (Operation 850). Operation 850 may be performed by the speaker unit 750.

The technical spirit and configurations of operations of the method of outputting an audio signal according to an exemplary embodiment as described above are identical or similar to those of an audio signal outputting apparatus as described above with reference to FIGS. 1 through 7, and thus detailed descriptions thereof will be omitted.

While not restricted thereto, an exemplary embodiment can be embodied as computer-readable code on a computer-readable recording medium. The computer-readable recording medium is any data storage device that can store data that can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network-coupled computer systems so that the computer-readable code is stored and executed in a distributed fashion. Also, an exemplary embodiment may be written as a computer program transmitted over a computer-readable transmission medium, such as a carrier wave, and received and implemented in general-use or special-purpose digital computers that execute the programs. Moreover, one or more units of the audio signal outputting apparatus can include a processor or microprocessor executing a computer program stored in a computer-readable medium.

While the exemplary embodiments have been particularly shown and described above, it will be understood by those of ordinary skill in the art that various changes in form and details may be made therein without departing from the spirit and scope of the present inventive concept as defined by the following claims.

What is claimed is:

1. An audio signal outputting apparatus comprising:
   a pulse width modulation (PWM) unit which generates a carrier signal, compares a signal level of the carrier signal with a signal level of an audio signal, and generates a PWM signal based on a result of the comparison;
   a controller which, based on a level of the audio signal, controls the PWM unit to set a signal shape of the carrier signal to prevent the audio signal outputting apparatus from performing an operation exceeding a maximum output; and
   a switching power unit which amplifies the PWM signal generated by the PWM unit and outputs the amplified PWM signal,
   wherein a duration of a logic high level of the PWM signal and a gain of the audio signal are changed based on the signal shape of the carrier signal.

2. The audio signal outputting apparatus of claim 1, wherein, when the level of the audio signal is higher than a predetermined standard level, the controller controls the PWM unit to change the signal shape of the carrier signal to reduce the duration of the logic high level of the PWM signal.

3. The audio signal outputting apparatus of claim 1, wherein, when the level of the audio signal is lower than a predetermined standard level, the controller controls the PWM unit to change the signal shape of the carrier signal to increase the duration of the logic high level of the PWM signal.

4. The audio signal outputting apparatus of claim 1, wherein the controller further comprises a storage unit which stores information about the signal shape of the carrier signal corresponding to the level of the audio signal.

5. The audio signal outputting apparatus of claim 1, wherein the controller controls the PWM unit to change the signal shape of the carrier signal to adjust the duration of the logic high level of the PWM signal for each signal level period of the audio signal having a different range of levels of the audio signal.

6. The audio signal outputting apparatus of claim 5, wherein the controller controls the PWM unit to change the signal shape of the carrier signal to reduce the duration of the logic high level of the PWM signal in a first period in which a zero cross of the audio signal occurs.

7. The audio signal outputting apparatus of claim 6, wherein the controller controls the PWM unit to change the signal shape of the carrier signal to increase the duration of the logic high level of the PWM signal in a second period in which the level of the audio signal is equal to or greater than an upper limit of the first period and is less than or equal to a predetermined standard level.

8. The audio signal outputting apparatus of claim 7, wherein the controller controls the PWM unit to change the signal shape of the carrier signal to reduce the duration of the logic high level of the PWM signal in a third period in which the level of the audio signal is equal to or greater than the predetermined standard level.

9. The audio signal outputting apparatus of claim 1, further comprising a loop filter which detects an output level of the amplified PWM signal and monitors whether the amplified PWM signal exceeds a maximum output level.

10. The audio signal outputting apparatus of claim 9, wherein the controller receives a result of the monitoring from the loop filter, and
wherein, when the level of the amplified PWM signal exceeds the maximum output level, the controller controls the PWM unit to change the signal shape of the carrier signal to reduce the duration of the logic high level of the PWM signal.

11. The audio signal outputting apparatus of claim 1, further comprising a speaker unit which receives the amplified PWM signal, changes the amplified PWM signal to a sound signal, and outputs the sound signal.

12. A method of outputting an audio signal, the method comprising:
detecting a level of an audio signal;
generating a carrier signal having a signal shape that is set based on the detected level of the audio signal to prevent the audio signal outputting apparatus from performing an operation exceeding a maximum output;
comparing a signal level of the carrier signal with a signal level of the audio signal;
generating the PWM signal based on a result of the comparing; and
amplifying the PWM signal and outputting the amplified PWM signal,
wherein a duration of a logic high level of the PWM signal and a gain of the audio signal are changed based on the signal shape of the carrier signal.

13. The method of claim 12, wherein the generating the carrier signal having the signal shape that is changed based on the detected level of the audio signal comprises changing the signal shape of the carrier signal, when the level of the audio signal is higher than a predetermined standard level, to reduce the duration of the logic high level of the PWM signal.

14. The method of claim 12, wherein the generating the carrier signal having the signal shape that is changed based on the detected level of the audio signal comprises, when the level of the audio signal is lower than a predetermined standard level, changing the signal shape of the carrier signal to increase the duration of the logic high level of the PWM signal.

15. The method of claim 12, further comprising storing information about the signal shape of the carrier signal corresponding to the level of the audio signal.

16. The method of claim 12, wherein the generating the carrier signal having the signal shape that is changed based on the detected level of the audio signal comprises changing the signal shape of the carrier signal to adjust the duration of the logic high level of the PWM signal for each signal level period of the audio signal having different range of levels of the audio signal.

17. The method of claim 16, wherein the changing the signal shape of the carrier signal comprises changing the signal shape of the carrier signal to reduce the duration of the logic high level of the PWM signal in a first period in which a zero cross of the audio signal occurs.

18. The method of claim 17, wherein the changing the signal shape of the carrier signal comprises changing the signal shape of the carrier signal to increase the duration of the logic high level of the PWM signal in a second period in which the level of the audio signal is equal to or greater than an upper limit of the first period and is less than or equal to a predetermined standard level.

19. The method of claim 18, wherein the changing of the signal shape of the carrier signal comprises changing the signal shape of the carrier signal to reduce the duration of the logic high level of the PWM signal in a third period in which the level of the audio signal is equal to or greater than the predetermined standard level.

20. The method of claim 12, further comprising detecting an output level of the amplified PWM signal and determining whether the output level of the amplified PWM signal exceeds a maximum output level.

21. The method of claim 20, further comprising, when it is determined that the output level of the amplified PWM signal exceeds the maximum output level, changing the signal shape of the carrier signal to reduce the duration of the logic high level of the PWM signal.

22. The method of claim 12, further comprising changing the amplified PWM signal to a sound signal and outputting the sound signal.

23. A method of outputting an audio signal, the method comprising:
generating a carrier signal;
comparing a signal level of the carrier signal with a signal level of an audio signal;
generating a pulse width modulation (PWM) signal based on a result of the comparing; and
controlling a duration of a logic high level of the PWM signal by setting a signal shape of the carrier signal according to a level of the audio signal to prevent the audio signal outputting apparatus from performing an operation exceeding a maximum output.

* * * * *